US 6,770,948 B2

(12) United States Patent
Ito et al.

(10) Patent No.: US 6,770,948 B2
(45) Date of Patent: Aug. 3, 2004

(54) INTEGRATED FUSE WITH REGIONS OF DIFFERENT DOPING WITHIN THE FUSE NECK

(75) Inventors: Akira Ito, Irvine, CA (US); Henry Kuoshun Chen, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/409,584

(22) Filed: Apr. 9, 2003

(65) Prior Publication Data

US 2003/0205777 A1 Nov. 6, 2003

Related U.S. Application Data

(63) Continuation of application No. 10/115,013, filed on Apr. 4, 2002, now Pat. No. 6,580,156.

(51) Int. Cl.[7] .............................................. H01L 29/00
(52) U.S. Cl. ....................... 257/529; 257/173; 257/209; 257/665; 257/910; 102/202.4; 361/275.1; 438/467; 438/600; 438/601
(58) Field of Search ................................. 257/173, 209, 257/529, 665, 910; 102/202.4; 361/275.1; 438/467, 600, 601

(56) References Cited

U.S. PATENT DOCUMENTS

| 5,708,291 | A | * | 1/1998 | Bohr et al. .................. 257/529 |
| 5,854,510 | A | * | 12/1998 | Sur, Jr. et al. .............. 257/529 |
| 6,525,397 | B1 | * | 2/2003 | Kalnitsky et al. ........... 257/529 |
| 6,580,156 | B1 | * | 6/2003 | Ito et al. ..................... 257/665 |

\* cited by examiner

Primary Examiner—Nathan J. Flynn
Assistant Examiner—Scott R Wilson
(74) Attorney, Agent, or Firm—Sterne, Kessler, Goldstein & Fox P.L.L.C.

(57) ABSTRACT

An integrated fuse has regions of different doping located within a fuse neck. The integrated fuse includes a polysilicon layer and a silicide layer. The polysilicon layer includes first and second regions having different types of dopants. In one example, the first region has an N-type dopant and the second region has a P-type dopant. The polysilicon layer can also include a third region in between the first and second regions, which also has a different dopant. During a fusing event, a distribution of temperature peaks around the regions of different dopants. By locating regions of different dopants within the fuse neck, agglomeration of the silicide layer starts reliably within the fuse neck (for example, at or near the center of the fuse neck) and proceeds toward the contact regions. An improved post fuse resistance distribution and an increased minimum resistance value in the post fuse resistance distribution is realized compared to conventional polysilicon fuses.

12 Claims, 7 Drawing Sheets

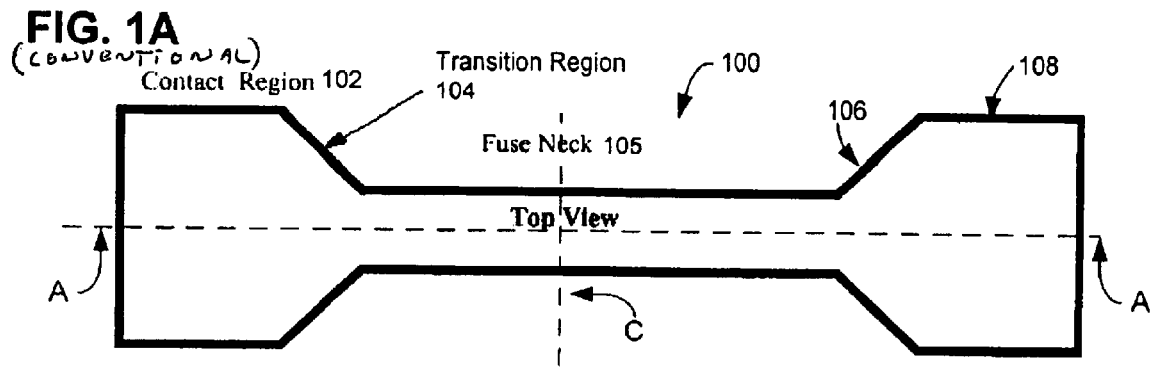
FIG. 1A (Conventional)
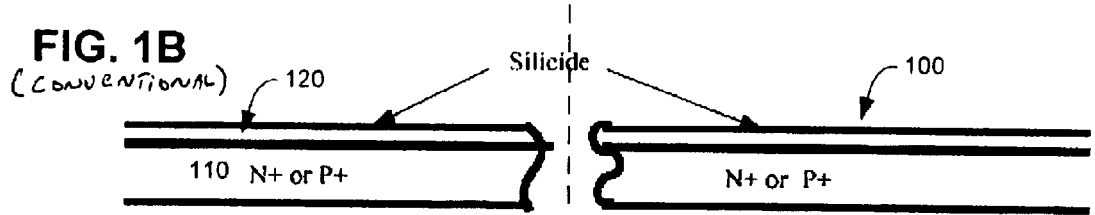
FIG. 1B (Conventional)
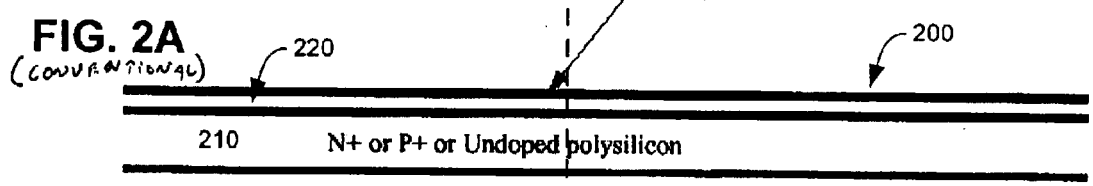
FIG. 2A (Conventional)
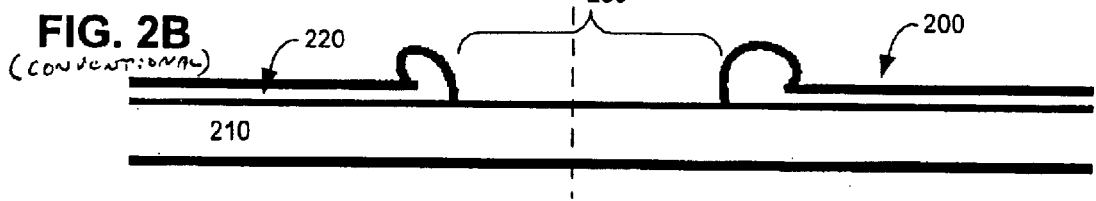
FIG. 2B (Conventional)

INTEGRATED FUSE WITH REGIONS OF DIFFERENT DOPING WITHIN THE FUSE NECK

CROSS-REFERENCE TO RELATED APPLICATIONS

This application is a continuation of the U.S. Non-Provisional Application entitled "An Integrated Fuse With Regions of Different Doping Within The Fuse Neck," Ser. No. 10/115,013, filed Apr. 4, 2002, now U.S. Pat. No. 6,580,156 which is incorporated by reference herein in its entirety.

BACKGROUND OF THE INVENTION

1. Field of the Invention

The present invention relates to semiconductor devices and methods. In particular, the present invention relates to integrated fuses.

2. Background Art

Integrated fuses, such as polysilicon fuses, are used as programmable elements in a variety of applications. An integrated fuse can be programmed or set to an open or closed state. The open and closed states are also referred to as conditions where the fuse is "blown" or "unblown." Typically, an integrated fuse can be programmed to change from an unblown state to a blown state by applying an electric current of sufficient strength to increase the resistance of the fuse. Example applications which use integrated fuses as programmable elements include: programmable read only memory (PROM), static random access memory (SRAM), redundancy implementation in logic devices, die identification, electrically programmable feature selection, and CMOS logic elements. See, Alvai, M., et al., "A PROM Element Based on Salicide Agglomeration of Poly Fuses in a CMOS Logic Process," *IEDM*:855–858 (1997) (referred to herein as the "Alvai article"), and Kalnitsky, A., et al., "CoSi$_2$ Integrated Fuses on Poly Silicon for Low Voltage 0.18 µm CMOS Applications," *IEDM*:765–768 (1999) (referred to herein as the "Kalnitsky article"), both of which are incorporated herein by reference in their entirety.

FIG. 1A is a top view that shows the geometry of a conventional polysilicon fuse 100. FIG. 1B is a cross-sectional view taken along line A—A of FIG. 1A. As shown in FIG. 1A, polysilicon fuse 100 generally includes two contact regions 102, 108 bridged by two transition regions 104, 106 and fuse neck 105. The center of fuse 100 is indicated by the dashed line C. Polysilicon fuse 100 is made up of a heavily doped N type (N+) or heavily doped P type (P+) polysilicon layer 110 with or without silicide layer 120 as shown in FIG. 1B. The unblown fuse resistance of fuse 100 is preferably low in the range of 50 to 100 ohms (Ω). Polysilicon fuse 100 becomes electrically open by applying a sufficient amount of energy in a form of current flow so as to blow the fuse. In this example, both silicide layer 120 and polysilicon layer 110 can be blown open as shown in FIG. 1B. The difference in the pre(unblown) and post(blown) fuse resistance values can be made many orders of magnitude such that the blown fuse acts as an open circuit. This open state is shown in FIG. 1B by the presence of a gap within fuse neck 105. This gap may not necessarily occur at the center, however, and may instead start at the contact regions.

In addition, as CMOS device sizes decrease, it is increasingly difficult to blow a polysilicon fuse since the corresponding supply voltage also becomes small. An external power supply is often needed to generate sufficient current flow to create an adequate open fuse state. This is a more costly solution. It is therefore sufficient to blow open only the silicide layer to program the polysilicon fuse. This can be done by the limited internal power supply.

FIGS. 2A and 2B show one conventional polysilicon fuse 200 used as a programmable element as described in the above-referenced Alvai article. As shown in FIG. 2A, polysilicon fuse 200 is formed from a suicide layer 220 on the top of a polysilicon layer 210. Polysilicon layer 210 can be undoped, N+ doped, or P+ doped as shown in FIG. 2A. Silicide layer 220 can include titanium silicide, nickel silicide, platinum silicide, or cobalt silicide. FIG. 2B shows fuse 200 in an open state where the silicide layer has been programmed to create a region 230 where the resistance is made higher because current is now conducted through the higher resistance polysilicon layer 210. The break in the silicide layer may not necessarily occur at the center, however, and may instead start at the contact regions.

Region 230 is created by passing electrical current through silicide layer 220 as part of an agglomeration process. The location where region 230 occurs along fuse 200 is referred to the "fusing location." The fusing location has been reported to be a function of temperature gradient in addition to fuse geometry and pre fuse resistance. See, Alvai, M., et al, *IEDM*:855–858 (1997).

It is increasingly desirable to achieve a polysilicon fuse having a high mean post fuse resistance with a tight post fuse resistance distribution for a given geometry and pre fuse resistance. Agglomeration needs to reliably start at or very near the center of the fuse neck and proceed toward the contact regions. Further, an improved post fuse resistance distribution and an increased minimum resistance value in the post fuse resistance distribution is needed.

BRIEF SUMMARY OF THE INVENTION

The present invention provides an integrated fuse with regions of different doping located within a fuse neck. During a fusing event, a distribution of temperature peaks occur around the regions of different dopants. By locating regions of different dopants within the fuse neck, agglomeration starts reliably and efficiently within the fuse neck (for example, at or near the center of the fuse neck) and proceeds toward the contact regions.

Further advantages of integrated fuses according to the present invention can include an improved post fuse resistance distribution and an increased minimum resistance value in the post fuse resistance distribution compared to conventional polysilicon fuses. Integrated fuses of the present invention can be used in variety of applications including but not limited to programmable elements.

According to the present invention, an integrated fuse has a polysilicon layer and a silicide layer. The polysilicon layer includes first and second regions each having an end within the fuse neck of the integrated fuse. The first and second regions have first and second types of dopants. These types of dopants are different. In one example, the first type of dopant in the first region comprises an N-type dopant and the second type of dopant in the second region comprises a P-type dopant. In this way, a fusing event is initiated within the fuse neck region when the integrated fuse receives an electrical current stress.

In one embodiment, the first region and second regions are adjacent to one another such that each of the one ends of the first and second regions meet or abut at a common interface. The common interface is located at or near the center of the fuse neck region. In one example implementation, the first type of dopant in the first region is a heavily-doped N-type dopant and the second type of dopant in the second region is a heavily-doped P-type dopant. In another example implementation, the first type of dopant in the first region is a lightly-doped N-type dopant and the second type of dopant in the second region is a lightly-doped P-type dopant.

In another embodiment, the polysilicon layer further includes a third region located at or near the center of the fuse neck region and in between first and second regions of the polysilicon layer. In one implementation, the third region is undoped, while the first type of dopant in the first region is a heavily-doped N-type dopant and the second type of dopant in the second region is a heavily-doped P-type dopant. In another example implementation, the third region is undoped, while the first type of dopant in the first region is a lightly-doped N-type dopant and the second type of dopant in the second region is a lightly-doped P-type dopant.

In another embodiment, the polysilicon layer further includes a third region which is lightly doped with N-type and P-type dopants. First and second regions next to the third region are lightly-doped with respective N-type and P-type dopants.

In another embodiment, the polysilicon layer further includes a third region which is heavily doped with N-type and P-type dopants. First and second regions next to the third region are then heavily-doped with respective N-type and P-type dopants.

Finally, the present invention includes a method for making an integrated fuse. The method includes steps of forming a polysilicon layer that includes first and second regions having different first and second types of dopants, and forming a silicide layer along the polysilicon layer.

Further features and advantages of the present invention, as well as the structure and operation of various embodiments of the present invention, are described in detail below with reference to the accompanying drawings.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the pertinent art to make and use the invention.

FIG. 1A is a top view showing the geometry of conventional polysilicon fuse.

FIG. 1B is a cross-sectional view of the conventional polysilicon fuse of FIG. 1A in a blown state with sufficient energy to blow open both the silicide layer and the polysilicon layer.

FIG. 2A is a cross-sectional view of another conventional polysilicon fuse.

FIG. 2B is a cross-sectional view of the conventional polysilicon fuse of FIG. 2A in a blown state after agglomeration.

FIGS. 3A, 3B, 4A, 4B, 5A, and 5B are cross-sectional views of polysilicon fuses according to embodiments of the present invention.

Figure 6:
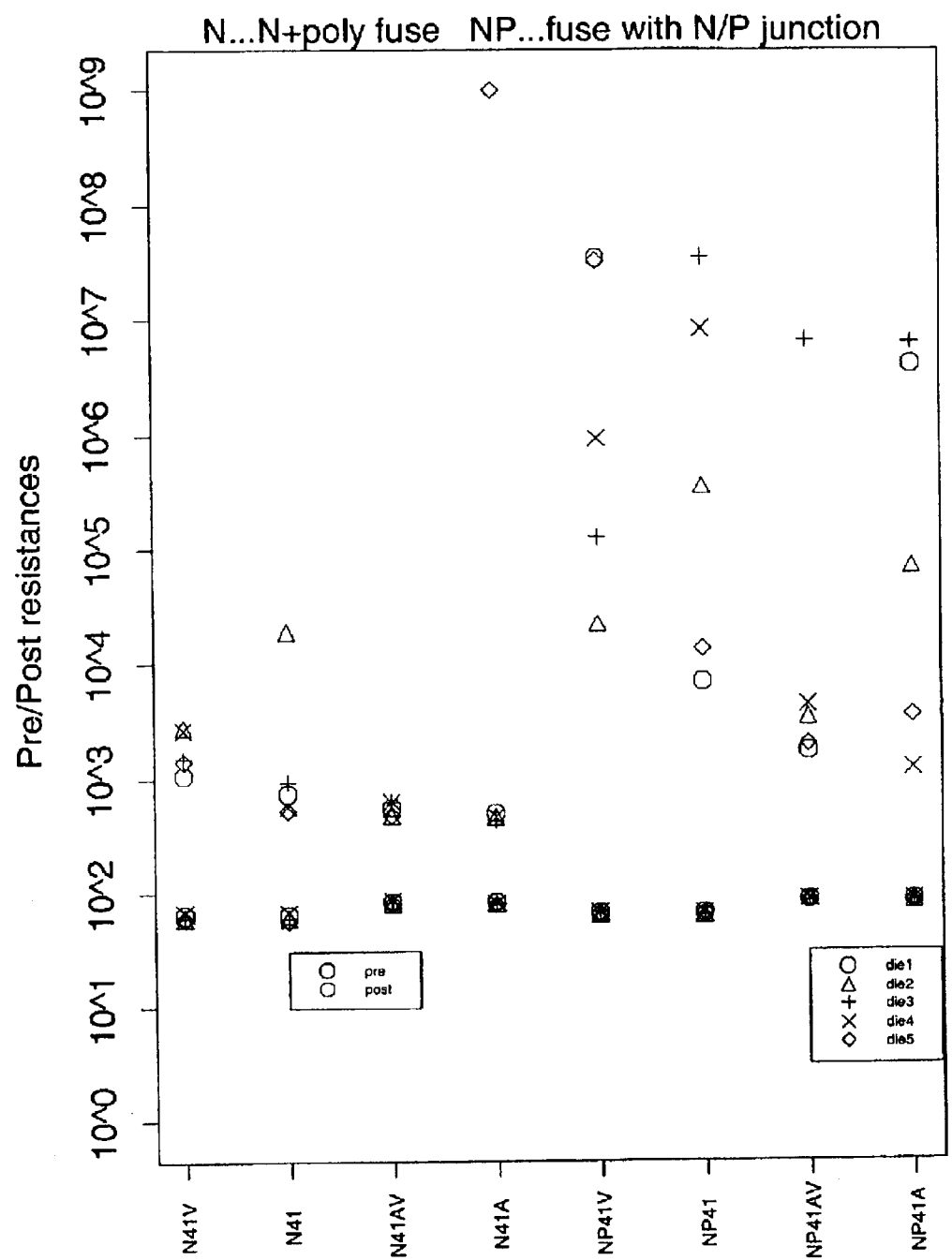

FIG. 6 shows a plot of pre and post fuse resistance values obtained in tests that compared samples of a conventional polysilicon fuse having a homogenous N+ polysilicon layer with an integrated fuse having a polysilicon layer with a N+/P+ butted region according to the invention.

Figure 7:
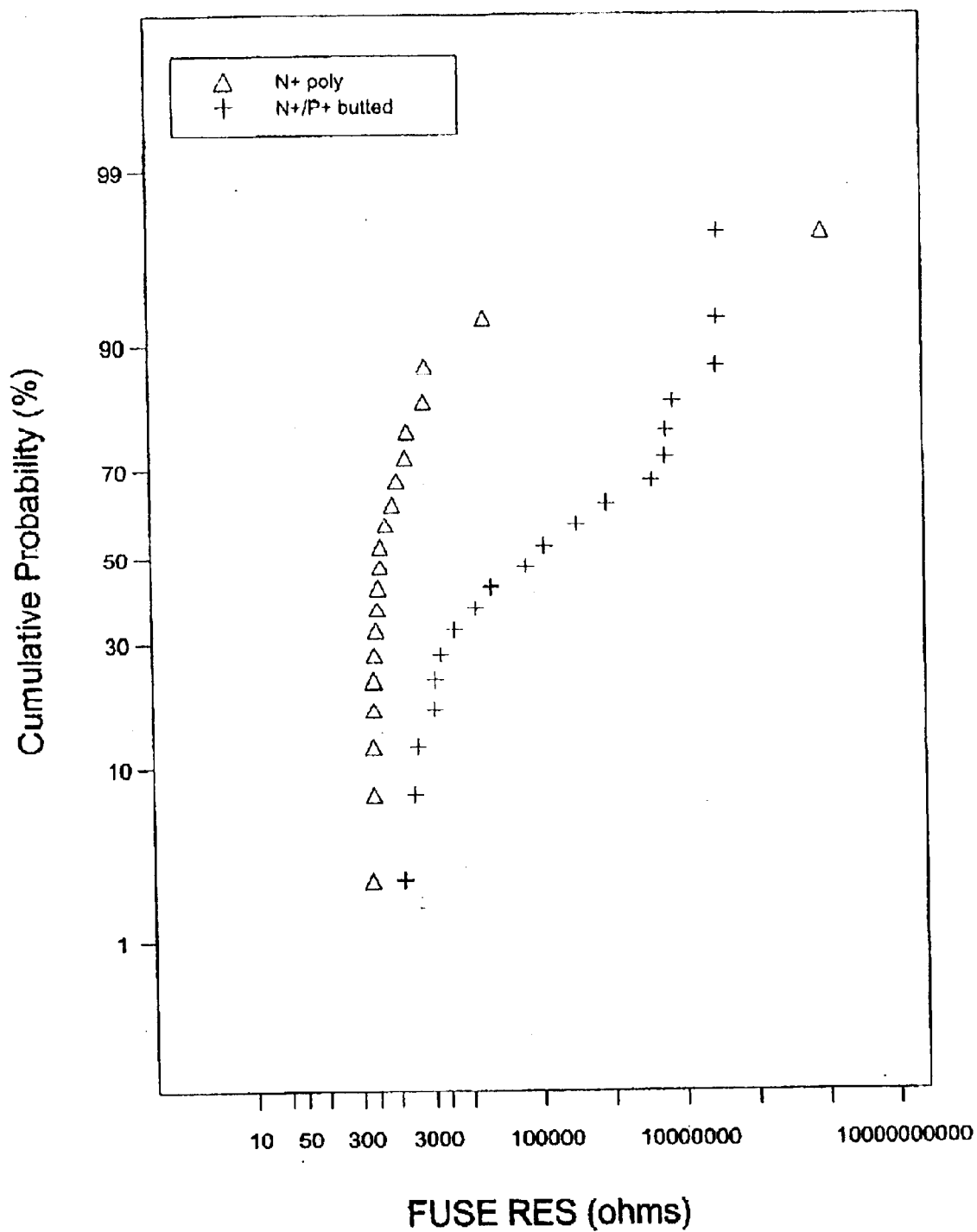

FIG. 7 is a plot of the cumulative probability of post fuse resistance values generated from the same samples shown in FIG. 6.

Figure 8:
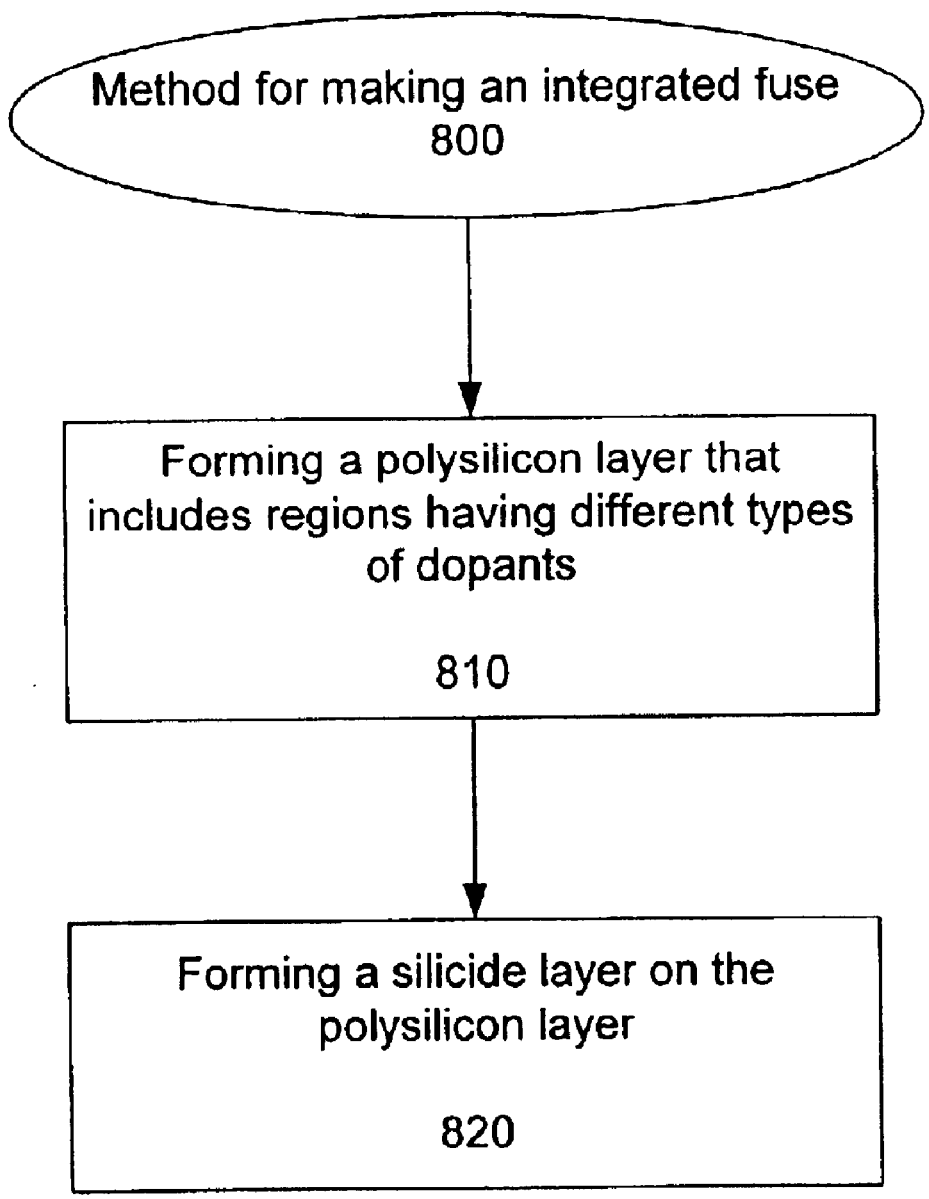

FIG. 8 is a flowchart of a method for making an integrated fuse according to an embodiment of the present invention.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Overview

The present invention provides an integrated fuse with regions of different doping located within a fuse neck. During a fusing event, a distribution of temperature peaks occur around the regions of different dopants. By locating regions of different dopants within the fuse neck, agglomeration starts reliably and efficiently within the fuse neck (for example, at or near the center of the fuse neck) and proceeds toward the contact regions. Further advantages of integrated fuses according to the present invention can include an improved post fuse resistance distribution and an increased minimum resistance value in the post fuse resistance distribution compared to conventional polysilicon fuses.

Integrated fuses of the present invention can be used in variety of applications including, but not limited to, fuses, programmable elements, programmable read only memory (PROM), static random access memory (SRAM), redundancy implementation in logic devices, die identification, electrically programmable feature selection, and CMOS logic elements.

Integrated Fuse Structures

FIGS. 3A, 3B, 4A, 4B, 5A, and 5B are cross-sectional views of integrated fuses according to embodiments of the present invention. Each of the cross-sectional views in FIGS. 3A–5B is taken along a plane extending through the respective integrated fuses and including a center of a fuse neck region between two contact regions. Each of the integrated fuses shown in FIGS. 3A–5B can have any conventional fuse geometry and shape including, but not limited to, the fuse shape shown in FIG. 1.

Figure 3A:
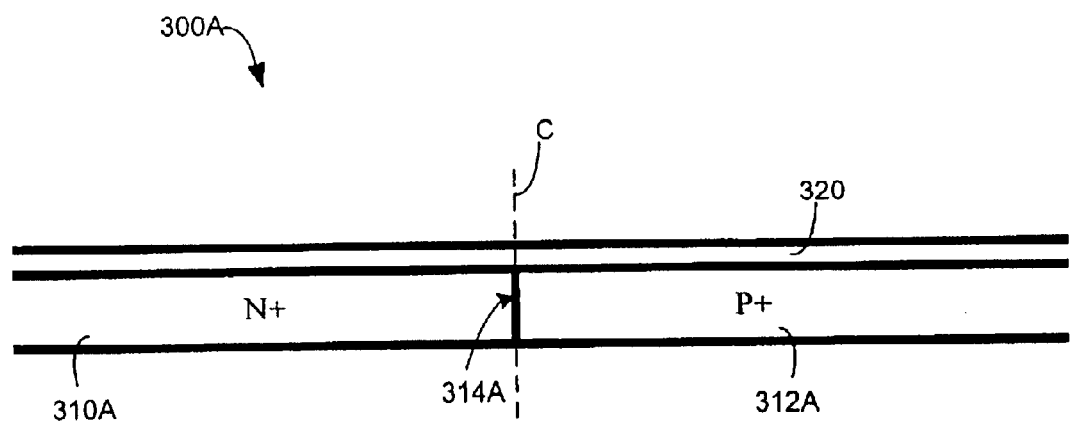
Figure 3B:
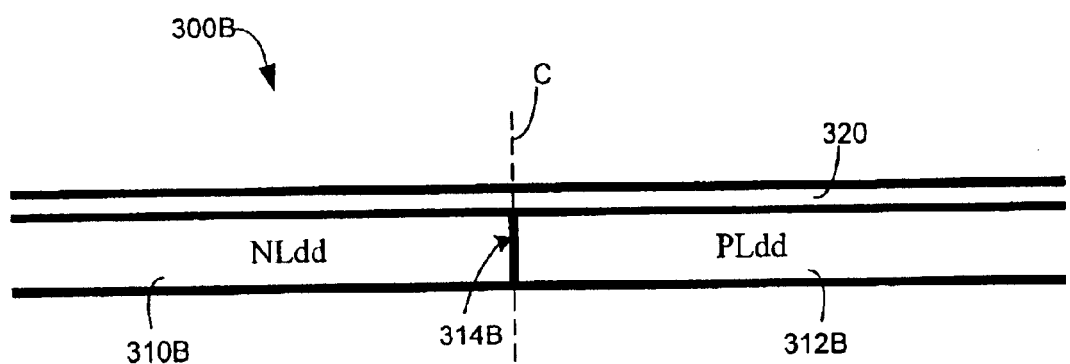

FIGS. 3A and 3B show integrated fuses 300A, 300B in a butted configuration according to the present invention. In FIG. 3A, integrated fuse 300A includes a polysilicon layer having a first region 310A and a second region 312A. Silicide layer 320 is formed on the polysilicon regions 310A, 312A. One end of each of the regions 310A, 312A abut each other at a common interface 314A. Common interface 314A is located at or near the center of a fuse neck region. First region 310A comprises polysilicon with heavily-doped N-type (N+) dopants. Second region 312A comprises polysilicon with heavily-doped P-type (P+) dopants. In this way, a fusing event is initiated within the fuse neck region at center C when the integrated fuse receives an electrical current stress. Alternatively, first region 310A can comprise polysilicon with P+ dopants, while second region 312A can comprise polysilicon with N+ dopants.

In FIG. 3B, integrated fuse 300B includes silicide layer 320 and a polysilicon layer having a first region 310B and a second region 312B. One end of each of the regions 310B, 312B abut each other at a common interface 314B. Common interface 314B is located at or near the center of a fuse neck region. First region 3101B comprises polysilicon with lightly-doped N-type (NLdd) dopants. Second region 312B comprises polysilicon with lightly-doped P-type (PLdd) dopants. In this way, a fusing event is initiated within the fuse neck region at center C when the integrated fuse receives an electrical current stress. Alternatively, first region 310B can comprise polysilicon with PLdd dopants, while second region 312B can comprise polysilicon with NLdd dopants.

Figure 4A:
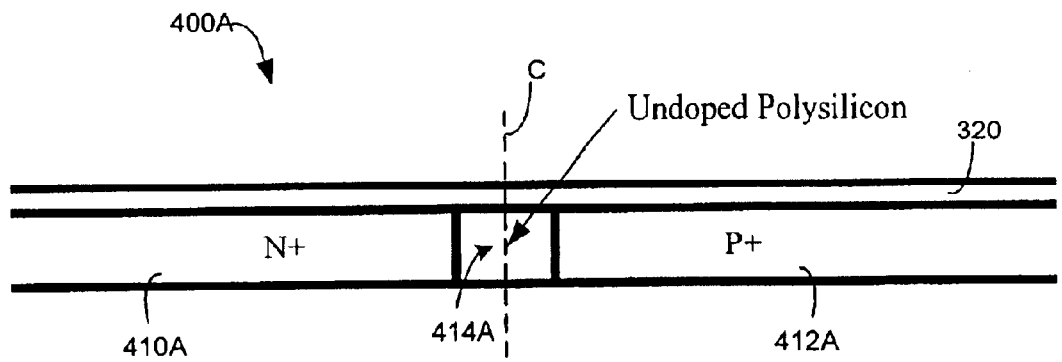
Figure 4B:
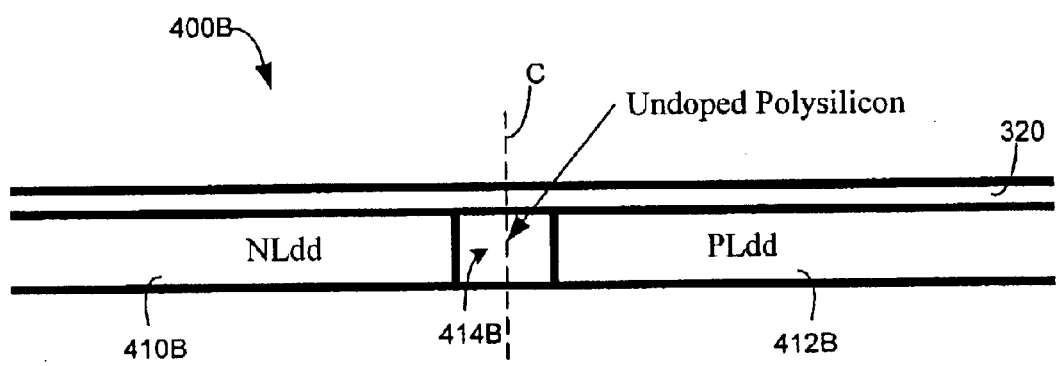

FIGS. 4A and 4B show integrated fuses 400A, 400B in a spaced configuration with an undoped center according to the present invention. As shown in FIG. 4A, integrated fuse 400A includes a polysilicon layer having a first region 410A and a second region 412A separated by an undoped region 414A. Silicide layer 320 is formed on the polysilicon regions 410A, 412A, and 414A. Undoped region 414A is located between regions 410A, 412A at or near the center C in the fuse neck region of integrated fuse 400A. First region 410A comprises polysilicon with heavily-doped N-type (N+) dopants. Second region 412A comprises polysilicon with heavily-doped P-type (P+) dopants. Undoped region 414A is made of undoped polysilicon. In this way, a fusing event is initiated within the fuse neck region at the undoped region 414A at or near center C when the integrated fuse receives an electrical current stress. Alternatively, first region 410A can comprise polysilicon with P+ dopants, while second region 412A can comprise polysilicon with N+ dopants.

Similarly, in FIG. 4B, integrated fuse 400B includes a polysilicon layer having a first region 410B and a second region 412B separated by an undoped region 414B. Silicide layer 320 is formed on the polysilicon regions 410B, 412B, and 414B. Undoped region 414B is located between regions 410B, 412B at or near the center C in the fuse neck region of integrated fuse 400B. First region 410B comprises polysilicon with lightly-doped N-type (NLdd) dopants. Second region 412B comprises polysilicon with lightly-doped P-type (PLdd) dopants. Undoped region 414B is made of undoped polysilicon. In this way, a fusing event is initiated within the fuse neck region at the undoped region 414B at or near center C when the integrated fuse receives an electrical current stress. Alternatively, first region 410B can comprise polysilicon with PLdd dopants, while second region 412B can comprise polysilicon with NLdd dopants.

Figure 5A:
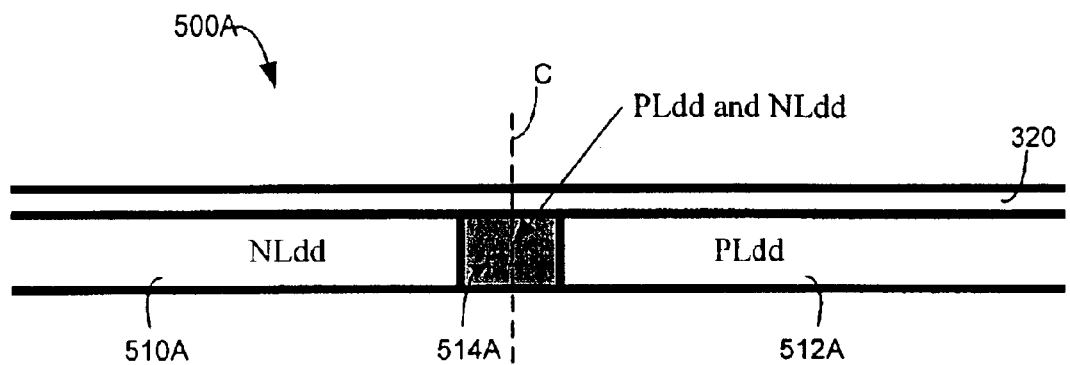
Figure 5B:
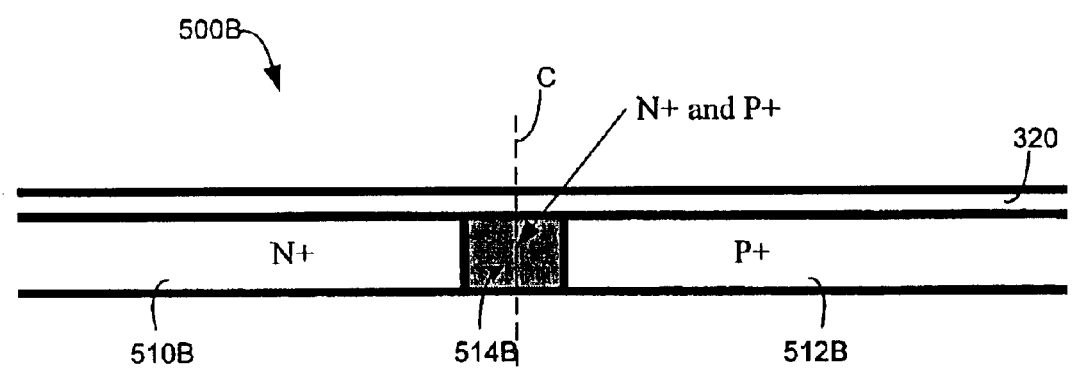

FIGS. 5A and 5B show integrated fuses 500A, 500B in a spaced configuration with a doped center according to the present invention. As shown in FIG. 5A, integrated fuse 500A includes a polysilicon layer having a first region 510A and a second region 512A separated by a doped region 514A. Silicide layer 320 is formed on polysilicon regions 510A, 512A, and 514A. Doped region 514A is located between regions 510A, 512A at or near the center C in the fuse neck region of integrated fuse 500A. First region 510A comprises polysilicon with lightly-doped N-type (NLdd) dopants. Second region 512A comprises polysilicon with lightly-doped P-type (PLdd) dopants. Doped region 514A is made up of polysilicon with lightly doped P-type and lightly-doped N-type dopants. In this way, a fusing event is initiated within the fuse neck region at the region 514A at or near center C when the integrated fuse receives an electrical current stress. Alternatively, first region 510A can comprise polysilicon with PLdd dopants, while second region 512A can comprise polysilicon with NLdd dopants.

Similarly, in FIG. 5B, integrated fuse 500B includes a polysilicon layer having a first region 510B and a second region 512B separated by a doped region 514B. Silicide layer 320 is formed on polysilicon regions 510B, 512B, and 514B. Doped region 514B is located between regions 510B, 512B at or near the center C in the fuse neck region of integrated fuse 500B. First region 510B comprises polysilicon with heavily-doped N-type (N+) dopants. Second region 512B is comprises polysilicon with heavily-doped P-type (P+) dopants. Doped region 514B is made up of polysilicon with heavily-doped P-type (P+) and heavily-doped N-type (N+) dopants. In this way, a fusing event is initiated within the fuse neck region at the region 514B at or near center C when the integrated fuse receives an electrical current stress. Alternatively, first region 510B can comprise polysilicon with P+ dopants, while second region 512B can comprise polysilicon with N+ dopants.

In each of the embodiments described above with respect to FIGS. 3A–5B, silicide layer 320 can include, but is not limited to, any one of the following materials: titanium silicide, nickel silicide, platinum silicide, or cobalt silicide. The polysilicon layer including regions 310A, 312A, 310B, 312B, 410A, 412A, 414A, 410B, 412B, 414B, 510A, 512A, 514A, 510B, 512B, and 514B can be formed on an isolation field oxide, such as, $SiO_2$.

The present invention can be used with lightly and/or heavily doped N and P dopants as described above. Any conventional doping ranges for lightly and/or heavily doped N and P dopants in polysilicon can be used as would be apparent to person skilled in the art given this description. Example ranges of dopants include the following: a range of $1 \times 10^{13}$ to $5 \times 10^{14}$ ions/cm$^2$ for lightly doped N dopants; a range of $1 \times 10^{13}$ to $5 \times 10^{14}$ ions/cm$^2$ for lightly doped P dopants; a range of $1 \times 10^{15}$ to $1 \times 10^{16}$ ions/cm$^2$ for heavily doped N dopants; and a range of $1 \times 10^{15}$ to $1 \times 10^{16}$ ions/cm$^2$ for heavily doped P dopants. These example ranges however are illustrative and not intended to limit the present invention.

Advantages

Each of the embodiments of polysilicon fuses 300A, 300B, 400A, 400B, 500A, 500B described above can have a tight post fuse resistance distribution and a high value of minimum post fuse resistance compared to conventional polysilicon fuses having a homogenous layer of polysilicon. Further, the polysilicon fuses according to the present invention have a structure that ensures agglomeration reliably starts at or very near the center of the fuse neck (where the different doping regions meet) and proceeds toward the beginning of the contact regions.

During a fusing event, an electrical current of sufficient strength is applied to open the fuse. This current causes agglomeration in silicide layer 320. The structures of polysilicon fuses 300A, 300B, 400A, 400B, 500A, 500B, as described above, have regions of different doping within the fuse neck. These regions, which are formed prior to silicidation, create temperature distributions with one or more peaks at or around the center of the fuse neck region. Each peak coincides with a boundary between regions having different dopants (e.g., the N+/P+ butted, NLdd/PLdd butted, undoped, PLdd and NLdd, N+ and P+ regions).

For example in the case of the butted configuration of FIG. 4A, during the agglomeration process, N+ and P+ dopants in the polysilicon fuse diffuse to the undoped region to form a lightly doped N+/P+ junction for the P+/undoped/N+ polysilicon structure. For the N+/P+ butted structure of FIG. 3A, the depletion layer becomes larger due to the dopant diffusion. The thermal conductivity is generally proportional to the conductivity of material. Thus, the peak of the temperature distribution tends to locate over the junction and the temperature gradients becomes larger due to the junction since the thermal conductivity over the lightly doped or depletion region is less than the N+ or P+ doped region.

FIG. 6 shows a plot of pre and post fuse resistance values obtained in tests that compared a conventional polysilicon fuse having a homogenous N+ polysilicon layer with an integrated fuse having a polysilicon layer with a N+/P+ butted region according to the invention. Five dies (dies 1–5) of samples were tested. Test data for samples of the conventional polysilicon fuse having a homogenous N+ polysilicon layer (N41V, N41, N41AV, N41A) is plotted along the bottom axis. Test data for samples of the fuse having a polysilicon layer with N+/P+ butted regions according to the invention (NP41V, NP41, NP41AV, NP41A) is also plotted along the bottom axis. Pre and post fuse resistance values in ohms for these fuse samples are plotted along the side axis. As shown in FIG. 6, the combination of a P/N junction and greater temperature gradient in fuse structures with N+/P+ butted regions according to the invention maximizes the post fuse resistance and increases the minimum value of the distribution of the post fuse resistance.

FIG. 7 is a plot of the cumulative probability of post fuse resistance values generated from the same samples shown in FIG. 6. The plot clearly shows that the post fuse resistance is higher for a fuse having a polysilicon layer with N+/P+ butted regions according to the invention compared to a conventional polysilicon fuse having a homogenous N+ polysilicon layer. The plot also shows that there is an increase in the minimum value of post fuse resistance for a fuse having a polysilicon layer with N+/P+ butted regions according to the invention, compared to a conventional polysilicon fuse having a homogenous N+ polysilicon layer.

Method for Making an Integrated Fuse

FIG. 8 shows a method 800 for making an integrated fuse according to an embodiment of the present invention (steps 810–820). First, a polysilicon layer is formed that includes regions having different types of dopants (step 810). Next, a silicide layer is formed on the polysilicon layer (step 820). These steps can be carried out using any conventional semiconductor manufacturing process, including but not limited to a CMOS process, as would be apparent to a person skilled in the art given this description. For instance, an undoped polysilicon layer is deposited and etched to form the polysilicon fuse layer, after one or more gate oxide layers are grown for a standard CMOS logic process. The N+, P+, NLdd, and PLdd regions (310A, 312A, 310B, 312B, 410A, 412A, 410B, 412B, 510A, 512A, 510B, 512B) in FIGS. 3A, 3B, 4A, 4B, 5A and 5B can be defined and formed by NLDD and PLDD masks and ion implantations of P and N dopants with a dose of $1\times10^{13}$–$5\times10^{14}$ ions/cm² before a spacer oxide is formed. The cross hatched area 514A in FIG. 5A receives both NLdd and PLdd dopants. The cross hatched area 514B in FIG. 5B receives both N+ and P+ dopants. Then silicide layer 320 can be formed by a deposition, for example, of one of the materials, cobalt, nickel, titanium, platinum and/or other silicide material, and proper heat treatments. Then the integrated fuse is defined by etching the non-silicide material away.

Conclusion

While various embodiments of the present invention have been described above, it should be understood that they have been presented by way of example only, and not limitation. It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. An integrated fuse, comprising:
one or more polysilicon layers;
wherein at least one of the layers includes (i) first and second regions arrayed along a longitudinal axis thereof and (ii) a third region positioned between the first and second regions, respective proximal ends of the first and second regions abutting respective sides of the third region;
wherein one of the first and second regions includes a first type dopant and the other includes a second type dopant; and
wherein the third region is one from the group including (i) an undoped region and (ii) a region having a doping range substantially equal to the first and second regions.

2. The integrated fuse of claim 1, wherein the fuse is programmable.

3. The integrated fuse of claim 1, wherein a distal end of each of the first and second regions defines respective first and second fuse contact portions.

4. The integrated fuse of claim 3, wherein the third region is a fuse neck; and
wherein the fuse neck is substantially centered along the longitudinal axis.

5. The integrated fuse of claim 1, wherein the first type dopant includes polysilicon having P-type dopants; and
wherein the second type dopant includes polysilicon having N-type dopants.

6. The integrated fuse of claim 5, wherein the N-type and P-type dopants are within a range of $1\times10^{15}$ to $5\times10^{16}$ ions/cm².

7. The integrated fuse of claim 6, wherein the third region includes undoped polysilicon.

8. The integrated fuse of claim 6, wherein the third region includes polysilicon having a region of P-type and N-type dopants within a range of $1\times10^{15}$ to $5\times10^{16}$ ions/cm².

9. The integrated fuse of claim 5, wherein the N-type and P-type dopants are within a range of $1\times10^{13}$ to $5\times10^{14}$ ions/cm².

10. The integrated fuse of claim 9, wherein the third region includes undoped polysilicon.

11. The integrated fuse of claim 9, wherein the third region includes polysilicon having a region of P-type and N-type dopants within a range of $1\times10^{13}$ to $5\times10^{14}$ ions/cm².

12. An apparatus for making an integrated fuse having a fuse neck region in between two contact regions, comprising:
means for forming a polysilicon layer that includes first and second regions having first and second types of dopants, respectively; and
means for forming a silicide layer on the polysilicon layer;
wherein the first and second regions of the polysilicon layer each have one end located in the fuse neck region, and the first and second types of dopants are different types of dopants,
wherein the polysilicon layer further includes a third region in between the first and second regions, the third region being one from the group including (i) an undoped region and (ii) a region having a doping range substantially equal to the first and second regions; and
wherein a fusing event is initiated within the fuse neck region when the integrated fuse receives an electrical current stress.

* * * * *

UNITED STATES PATENT AND TRADEMARK OFFICE
CERTIFICATE OF CORRECTION

PATENT NO.     : 6,770,948 B2
DATED          : August 3, 2004
INVENTOR(S)    : Akira Ito It is certified that error appears in the above-identified patent and that said Letters Patent is hereby corrected as shown below:

Drawings,
Please replace current Figures 1A-1B and 2A-2B with Figures 1A-1B and 2A-2B attached herein.

Signed and Sealed this

Twenty-ninth Day of March, 2005

JON W. DUDAS
*Director of the United States Patent and Trademark Office*

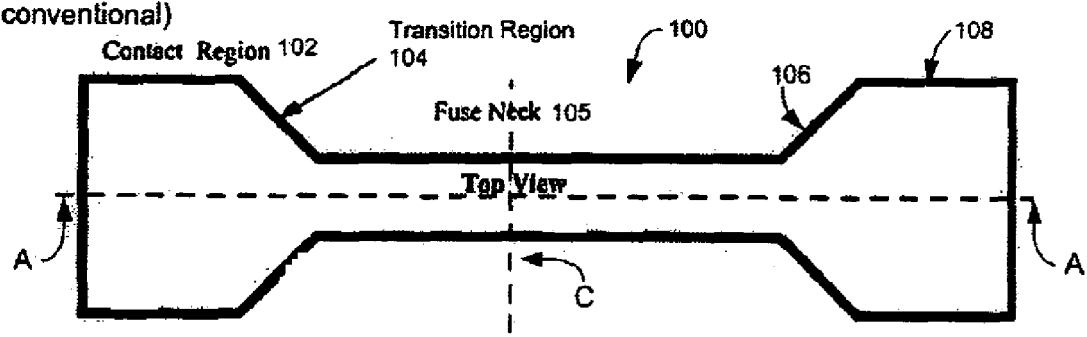
FIG. 1A (conventional)
Contact Region 102, Transition Region 104, Fuse Neck 105, 100, 106, 108, Top View, A—A, C
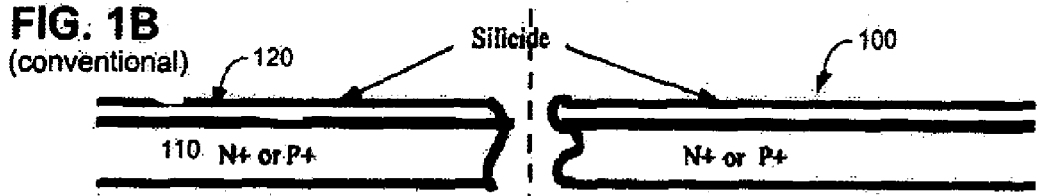
FIG. 1B (conventional)
120, Silicide, 100, 110 N+ or P+, N+ or P+
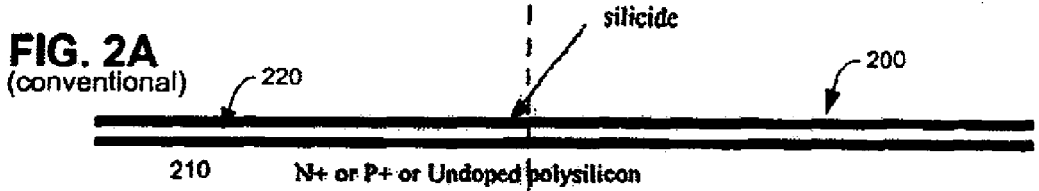
FIG. 2A (conventional)
silicide, 220, 200, 210 N+ or P+ or Undoped polysilicon
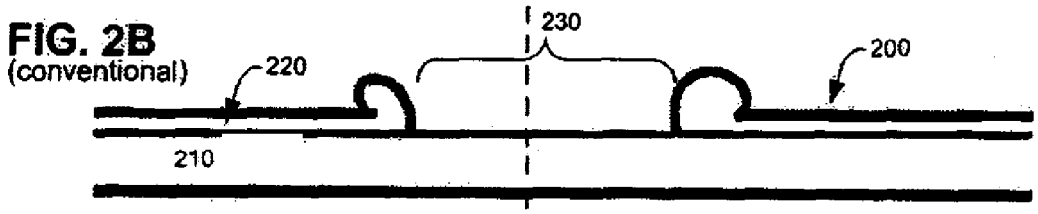
FIG. 2B (conventional)
220, 230, 200, 210